United States Patent
Lin (10) Patent No.: US 6,303,996 B2
(45) Date of Patent: Oct. 16, 2001

(54) HIGH PERFORMANCE SUB-SYSTEM DESIGN AND ASSEMBLY

(75) Inventor: Mou-Shiung Lin, Hsinchu (TW)

(73) Assignee: M. S. Lin, Hsin-Chu (TW)

( * ) Notice: Subject to any disclaimer, the term of this patent is extended or adjusted under 35 U.S.C. 154(b) by 0 days.

(21) Appl. No.: 09/729,152

(22) Filed: Dec. 4, 2000

Related U.S. Application Data (62) Division of application No. 09/258,911, filed on Mar. 1, 1999, now Pat. No. 6,180,426.

(51) Int. Cl.[7] .............................. H01L 23/52; H01L 29/40
(52) U.S. Cl. .............................................. 257/777; 438/15
(58) Field of Search .......................... 438/738; 257/777, 257/676, 320, 203, 734, 778, 202

(56) References Cited

U.S. PATENT DOCUMENTS

| | | | |
|---|---|---|---|
| 4,608,592 | * 8/1986 | Miyamoto | 357/80 |
| 5,461,333 | 10/1995 | Condon et al. | 327/208 |
| 5,481,205 | 1/1996 | Frye et al. | 324/757 |
| 5,534,465 | 7/1996 | Frye et al. | 437/209 |
| 5,731,945 | 3/1998 | Bertin et al. | 361/111 |
| 5,807,791 | * 9/1998 | Berlin et al. | 438/738 |
| 5,818,748 | 10/1998 | Bertin et al. | 365/51 |

* cited by examiner

Primary Examiner—Matthew Smith
Assistant Examiner—Calvin Lee

(74) *Attorney, Agent, or Firm*—George O. Saile; Stephen B. Ackerman; Billy Knowles

(57) ABSTRACT

A multiple integrated circuit chip structure provides interchip communication between integrated circuit chips of the structure with no ESD protection circuits and no input/output circuitry. The interchip communication is between internal circuits of the integrated circuit chips. The multiple integrated circuit chip structure has an interchip interface circuit to selectively connect internal circuits of the integrated circuits to test interface circuits having ESD protection circuits and input/output circuitry designed to communicate with external test systems during test and burn-in procedures. The multiple interconnected integrated circuit chip structure has a first integrated circuit chip mounted a second integrated circuit chip to physically and electrically connect the first integrated circuit chip to the second integrated circuit chip. The first integrated circuit chip has interchip interface circuits connected to the second integrated circuit chip to selectively communicate between internal circuits of the first and second integrated circuit chips or test interface circuits connected to the internal circuits of the first integrated circuit chip to provide stimulus and response to said internal circuits during testing procedures. The second integrated circuit chip has input/output interface circuitry to communicate with external circuitry connected to the second integrated circuit chip and to protect said second integrated circuit chip from electrostatic discharge voltages. Further, the second integrated circuit has interchip interface circuits connected to the first integrated circuit chip to communicate between the internal circuits of the first and second integrated circuit chips.

25 Claims, 9 Drawing Sheets

HIGH PERFORMANCE SUB-SYSTEM DESIGN AND ASSEMBLY

This is a division of patent application Ser. No. 09/258,911, filing date Mar. 1, 1999, High Performance Sub-System Design And Assembly, assigned to the same assignee as the present invention now U.S. Pat. No. 6,180,426.

BACKGROUND OF THE INVENTION

1. Field of the Invention

This invention relates to structures and methods of assembly of integrated circuit chips into interconnected multiple chip circuits. More particularly, this invention relates to "chip-on-chip" structures connected physically and electrically.

2. Description of the Related Art

The manufacture of embedded Dynamic Random Access Memory (DRAM) requires that process parameters that enhance the performance of the logic or the DRAM, if separately formed on semiconductor chips, be compromised when DRAM is embedded into an array of logic gates on the same semiconductor chip. This compromise has limited the application of embedded DRAM. If there is no compromise in the process parameters to enhance the performance of logic or the DRAM embedded DRAM, the manufacture process becomes very complicated and costly. Moreover, because of the structure of the embedded DRAM and the logic, burn-in of the embedded DRAM is not possible and embedding of DRAM with logic is not a reliable design solution.

Figure 1:
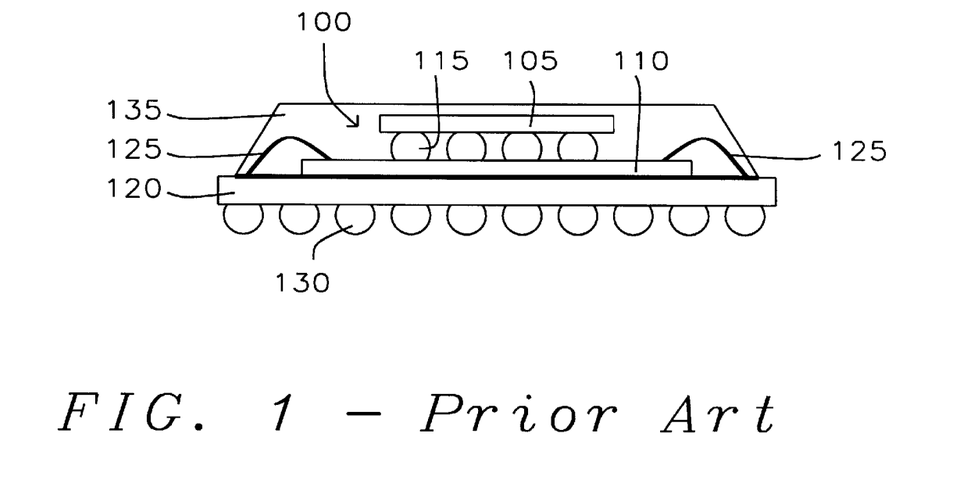
FIG. 1 shows a cross-sectional view of a "chip-on-chip" structure of the prior art.

A "chip-on-chip" structure is a viable alternative to embedded DRAM. With multiple chips connected in intimate contact, the process parameters that maximize the performance of the DRAM chip and the logic gates can be applied during manufacture. Refer to FIG. 1 for a description of a "chip-on-chip" structure 100. Such a "chip-on-chip" structure is described in U.S. Pat. No. 5,534,465 (Frye et al.). A first integrated circuit chip 105 is attached physically and electrically to a second integrated circuit chip 110 by means of an area array of solder bumps 115. The process of forming an area array of solder bumps 115 is well known in the art and is discussed in Frye et al. 465. The second chip 110 is then secured physically to a substrate 120. Electrical connections 125 between the second integrated circuit chip 110 and external circuitry (not shown) are created as either wire bonds or tape automated bonds. The module further has a ball grid array 130 to secure the structure to a next level of packaging containing the external circuitry. Generally, an encasing material 135 is placed over the "chip-on-chip" structure 100 to provide environmental protection for the "chip-on-chip" 100.

U.S. Pat. No. 5,481,205 (Frye et al.) teaches a structure for making temporary connections to integrated circuit chips having "solder bumps" or connection structures such as ball grid arrays. The temporary connections allow temporary contacting of the integrated circuit chip during testing of the integrated circuit chip.

The handling of wafers from which the integrated circuit chips are formed and the handling of the integrated circuit chip themselves causes the integrated circuit chips to be subjected to electrostatic discharge (ESD) voltages. Even though connections between the first integrated circuit chip 105 and the second integrated circuit chip 110 are relatively short and under normal operation would not be subjected to ESD voltages, require ESD protection circuitry to be formed within the interchip interface circuit to provide protection or necessary driving capacity for the first integrated circuit chip 105 and the second integrated circuit chip 110 during burn-in and other manufacturing monitoring processes.

U.S. Pat. Nos. 5,731,945 and 5,807,791 (Bertin et al.) teach a method for fabricating programmable ESD protection circuits for multichip semiconductor structures. The interchip interface circuit on each integrated circuit chip is formed with an ESD protection circuit and a switch to selectively connect the ESD protection circuit to an input/output pad. This allows multiple identical chips to be interconnected and redundant ESD protection removed.

The circuits at the periphery of integrated circuit chips generally are specialized to meet the requirements standardized specifications. These include relatively high current and voltage drivers and receivers for communicating on relatively long transmission line media. Alternately, as shown in U.S. Pat. No. 5,461,333 (Condon et al.) the interface may be differential to allow lower voltages on the transmission line media. This requires two input/output pads for transfer of signals.

U.S. Pat. No. 5,818,748 (Bertin et al.) illustrates a separation of chip function onto separate integrated circuits chips. This allows the optimization of the circuits. In this case, EEPROM is on one integrated circuits chip and drivers and decoders are on another. The chips are placed face to face and secured with force responsive self-interlocking micro-connectors.

Figure 2A:
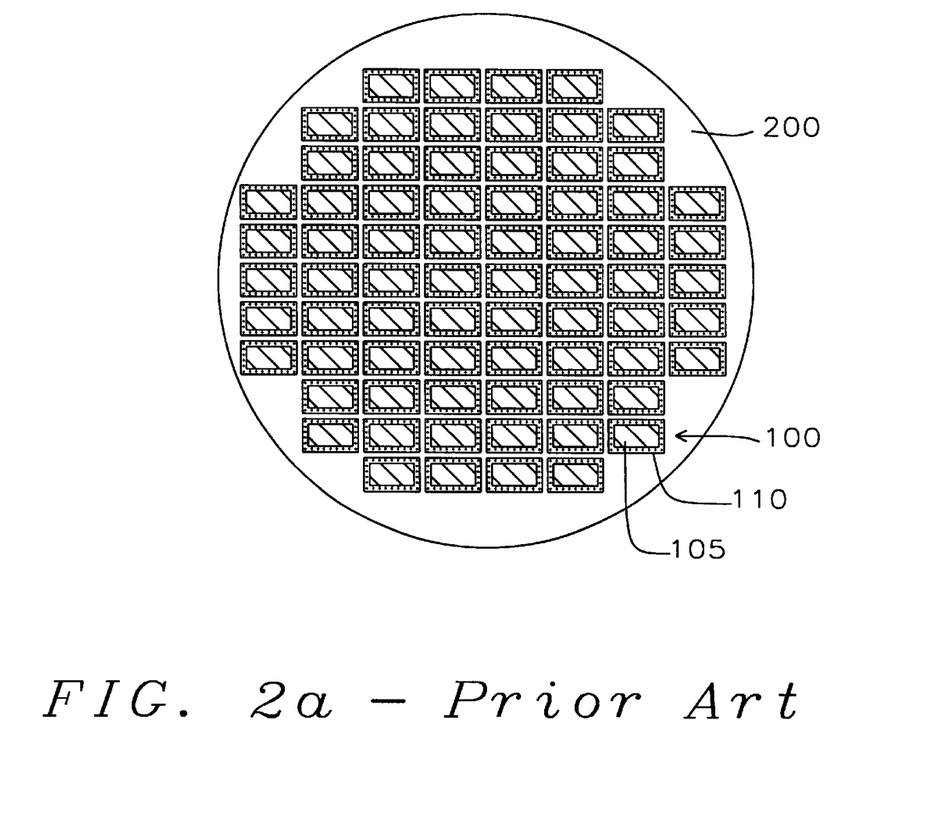
FIGS. 2a and 2b are respectively top view and a cross-sectional view of a "chip-on-chip" structure formed on a semiconductor wafer of the prior art.
Figure 2B:
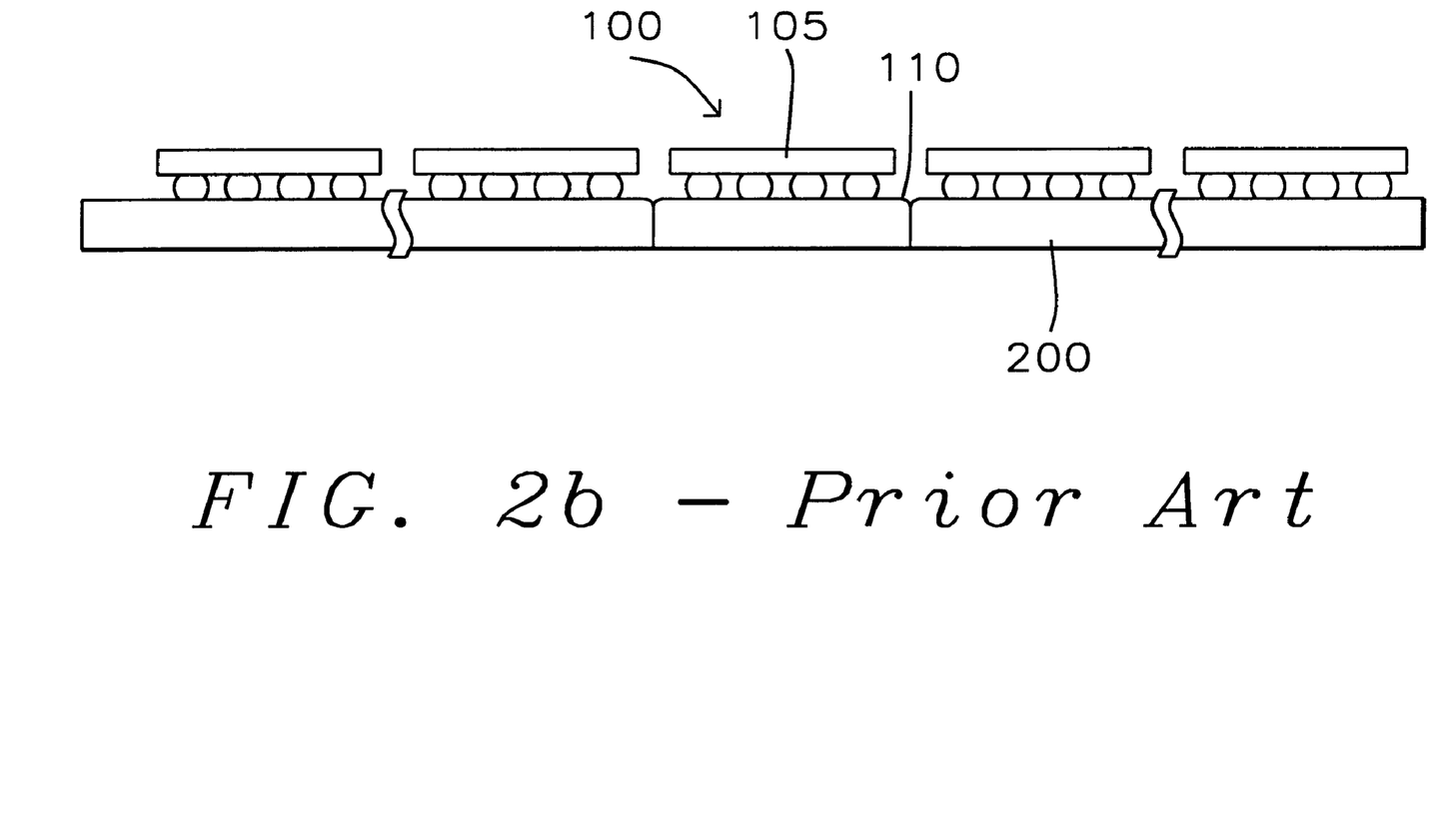

FIGS. 2a and 2b show multiple "chip-on-chip" structures 100 constructed on a wafer. Not shown is the forming of the first integrated circuit chip on a silicon wafer. The first integrated circuit chip is tested on the wafer and nonfunctioning chips are identified. The wafer is separated into the individual chips. The functioning first integrated circuit chips 105 then are "flip-chip" mounted on the second integrated circuit chip 110 on the wafer 200. The wafer 200 is then separated into the "chip-on-chip" structures 100. The "chip-on-chip" structures 100 are then mounted on the modules as above described.

SUMMARY OF THE INVENTION

An object of this invention is to provide a multiple integrated circuit chip structure where the interchip communication between integrated circuit chips of the structure have no ESD protection circuits and no input/output circuitry. The interchip communication is between internal circuits with a minimal electrical load.

Another object of this invention is to provide a circuit to selectively connect internal circuits of the integrated circuits to test interface circuits having ESD protection circuits and input/output circuitry designed to communicate with test systems during assembly and test.

To accomplish these and other objects, a multiple interconnected integrated circuit chip structure has a first integrated circuit chip mounted a second integrated circuit chip to physically and electrically connect the first integrated circuit chip to the second integrated circuit chip. The first integrated circuit chip may be mounted to the second integrated circuit chip by means of an area array of solder bumps. The first integrated circuit chip has interchip interface circuits connected to the second integrated circuit chip to communicate between internal circuits of the first and second integrated circuit chips and test circuits. The test circuits are connected to the internal circuits of the first integrated circuit chip to provide stimulus and response to the internal circuits during testing procedures.

The second integrated circuit chip has input/output interface circuitry to communicate with external circuitry connected to the second integrated circuit chip and to protect the second integrated circuit chip from electrostatic discharge voltages. Further, the second integrated circuit has interchip interface circuits connected to the first integrated circuit chip to communicate between the internal circuits of the first and second integrated circuit chips, and with test circuits. The test circuits are connected to the internal circuits of the second integrated circuit chip to provide stimulus to and response from the internal circuits during testing and burn-in procedures.

The interchip interface circuitry has an internal interface circuit for transferring electrical signals between the internal circuits of the second integrated circuit chip to the first integrated circuit chip. The interchip interface circuitry further has a mode select switch to selectively connect between the internal circuits of the first integrated circuits chip and the second integrated circuits chip or to the test interface circuits. The mode switch has three terminals and a control terminal. The first terminal is connected to an output of the internal interface circuit, a second terminal connected to the internal circuitry, and the third terminal connected to test circuits. A mode selector is connected to the control terminal. The state of the mode selector determines the connection between the first terminal and thus the output of the internal interface circuit, the second terminal and thus the internal circuitry, and the third terminal and thus the test interface. During normal operation, the first terminal is connected to the second terminal such that the internal circuits of the first and second integrated circuits are connected through their respective internal interfaces. During test and burn-in, the internal circuits are connected to the test circuits.

The test circuits are formed of a test interface circuit and an ESD protection device. The test interface circuit connected to communicate test signals from external test circuitry to the first and second integrated circuit chips. The ESD protection device protects the first and second integrated circuit chips from electrostatic discharge voltages. The test interface circuit is connected to the external test circuitry through an input/output pad temporarily connected to the external test circuitry during test and burn-in.

The first integrated circuit chip could be fabricated using a first type of semiconductor process and the second integrated circuit chip would be fabricated with a second type of semiconductor process that is not compatible with the first type of semiconductor process. As an example, the first integrated circuit chip could be an array of memory cells and the second integrated circuit chip would contain electronic circuitry formed with a process not compatible with a process of the array of memory cells. Alternatively, the second integrated circuit chip is an array of memory cells and the first integrated circuit chip contains electronic circuitry formed with a process not compatible with a process of the array of memory cells. Fabricating the first integrated circuit chip using its optimum semiconductor process, fabricating the second integrated circuit chip using its optimum semiconductor process, and then joining the first and second integrated circuit chips by this invention creates a multiple chip integrated circuit structure having maximum performance with minimum cost.

BRIEF DESCRIPTION OF THE DRAWINGS

FIGS. 4 a–d are schematics of the interchip interface circuits of this invention.

DETAILED DESCRIPTION OF THE INVENTION

Figure 3:
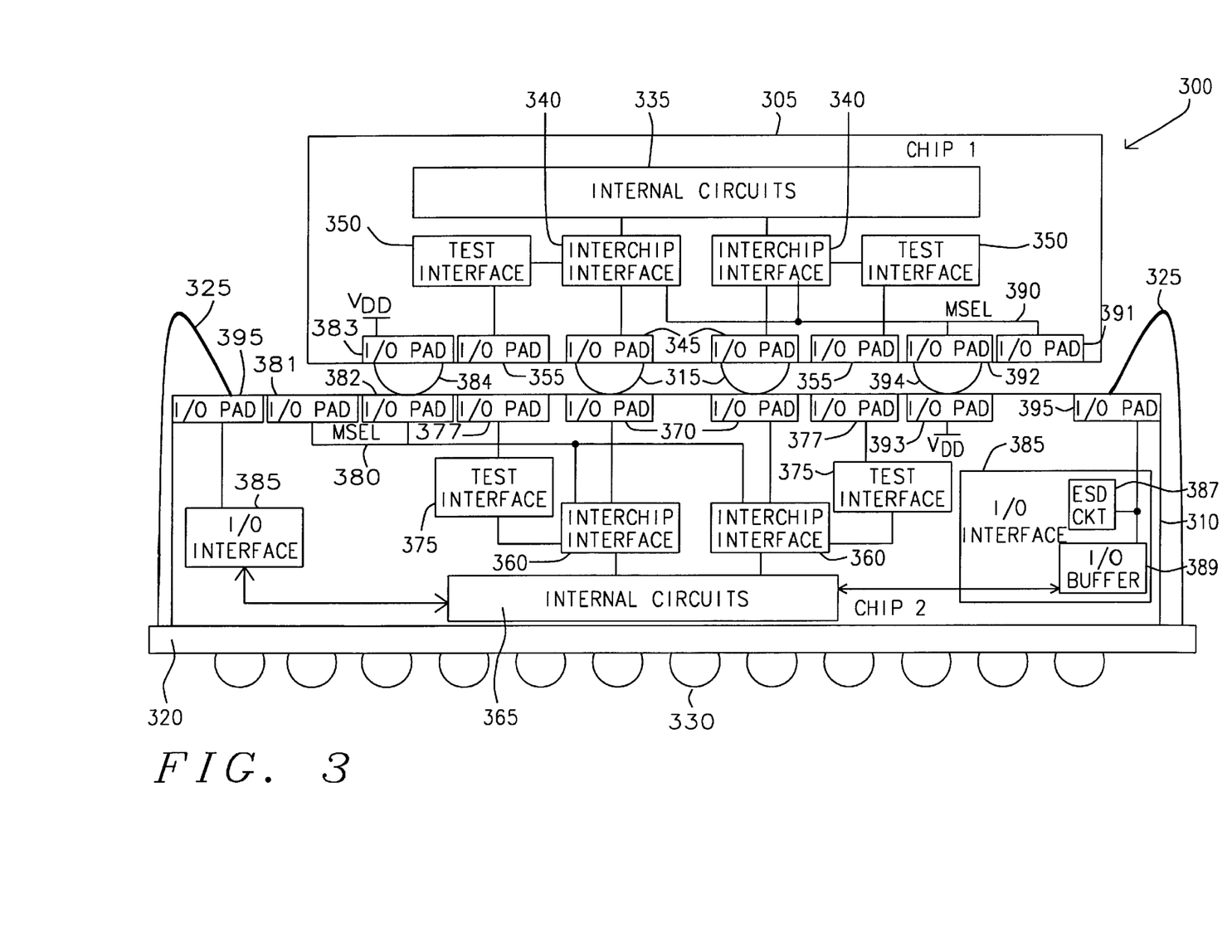
FIG. 3 is a cross-sectional view of a "chip-on-chip" structure, schematically the circuitry contained on each chip of the chip-on-chip structure of this invention.

A "chip-on-chip" structure 300 is shown in FIG. 3. A first integrated circuit chip 305 is attached to a second integrated circuit chip 310 by means of an area array of solder bumps 315 as described above. The second integrated circuit chip 310 is secured physically to the module 320. The electrical connections 325 are either wire bonds or TAB bonds. The module 320 has a ball grid array 330 to attach the "chip-on-chip" structure within the module to a next level of electronic package.

The first integrated circuit chip 305 ha's internal circuits 335, which are the functional electronic components of the first integrated circuit chip 305. The internal circuits 335 may be DRAM, logic, or other integrated circuits. Likewise, the second integrated circuit chip 310 has the internal circuits 365. The internal circuits 365 are the functional electronic components of the second integrated circuit chips 310. These internal circuits also may be DRAM, logic, or other integrated circuits. To transfer signals between the internal circuits 335 of the first integrated circuit chip 305 and the internal circuits 365 of the second chip 310 or to an external test system, the internal circuits 335 are connected to the interchip interface circuits 340. The interchip interface circuits 340 are connected through the input/output pads 345 to the area array of solder bumps 315 and thus to the second chip 310. This connection is functional during normal operation, when the first integrated circuit chip 305 is mounted to the second integrated circuit chip 310.

The interchip interface circuit 340 also is connected to the test interface 350. The test interface circuit 350 is connected to the test input/output pads 355. The test interface circuit 350 is functionally active during testing procedures, when test system probes are brought in contact with the test input/output pads 355. The test system probes provide test stimuli and receive response from the internal circuits 335.

The mode select 390 for the first integrated circuit chip 305 is accomplished by placing an appropriate logic level on the mode select input/output pads 391 and 392. When the first integrated circuit chip 305 is in contact with a test system during wafer testing or die testing during burn-in, the mode select input/output pad 391 is brought to a first logic level (0) to cause the interchip interface circuit 340 to transfer signals between the internal circuits 335 and the test interface 350. The test signals are then transferred between the test interface 350 and the test input/output pad 355 as described above.

When the first integrated circuit chip 305 is mounted to the second integrated circuit chip 310, the mode select line 390 is brought to a second logic level (1) through the mode select input/output pad 392. The second logic level (1) is a voltage equal to the power supply voltage source $V_{DD}$ and is achieved by connecting the mode select input output pad 392 to the mode select input/output pad 393 on the second integrated circuit chip 310 through the solder ball 394. The mode select input/output pad 393 is connected directly to the power supply voltage source $V_{DD}$ to achieve the second logic level (1). When the mode select line 390 is at the second logic level (1), the interchip interface 340 transfers signals of the internal circuits 335 to the input/output pads 345 to the second integrated circuit chip 310 as described above.

The internal circuits 365 of the second integrated circuit chip 310 likewise are connected to the interchip interface circuits 360. The interchip interface circuits 360 are connected to the input/output pads 370 and thus to the first integrated circuit chip 310 through the area array of solder bumps 315. The interchip interface circuits 360 are connected to the test interface circuits 375.

The internal circuits 365 of the second integrated circuit chip 310 are connected to the input/output interface 385. The input/output interface is connected to the input/output pad 395, which is connected to the module 320 through the bondwire 325. The input/output interface provides the circuitry to transfer signals between the internal circuits 365 and the external circuits attached through the next packaging level to the ball grid array 330 and thus to the wirebond 325.

The second integrated circuit chip 310 is tested prior to separation of a wafer containing the second integrated circuit chip 310, by bringing test probes or needles of the test system in contact with the input/output pads 395 and the test input/output pads 377. Subsequent to dicing of the wafer into individual second integrated circuit chips 310, the individual second integrated circuit chips 310 are mounted in a burn-in apparatus. The burn-in apparatus again is brought in contact with the input/output pads 395 and the test input/output pads 377 to provide stressing signals to the circuits of the second integrated circuit chip 310. Then, when the first integrated circuit chip 305 is mounted to the second integrated circuit chip 310, operation of the whole "chip-on-chip" assembly 300 is verified by attaching testing probes or contacts to the ball grid array 330. Signals from the testing probes are transferred between the circuits of the whole "chip-on-chip" assembly 300 through the bond wires 325 to the input/output pads 395.

The mode select 380 for the second integrated circuit chip 310 is accomplished by placing an appropriate logic level on the mode select input/output pads 381 and 382. When the second integrated circuit chip 310 is in contact with a test system during wafer testing or die testing during burn-in, the mode select input/output pad 381 is brought to a first logic level (0) to cause the interchip interface circuit 360 to transfer signals between the internal circuits 365 and the test interface 375. The test signals are then transferred between the test interface 375 and the test input/output pad 377 as described above.

When the first integrated circuit chip 305 is mounted to the second integrated circuit chip 310, the mode select line 380 is brought to a second logic level (1) through the mode select input/output pad 382. The second logic level (1) is achieved by connecting the mode select input output pad 382 to the mode select input/output pad 383 on the first integrated circuit chip 305 through the solder ball 384. The mode select input/output pad 383 is connected directly to the power supply voltage source $V_{DD}$ to achieve the second logic level (1). When the mode select line 380 is at the second logic level (1), the interchip interface 360 transfers signals of the internal circuits 365 to the input/output pads 370 to the first integrated circuit chip 305 as described above.

The input/output interface circuit 385 has an input/output buffer 389 connected to the internal circuits 365. The input/output buffer 389 is either a driver or receiver necessary to translate the signal levels of the internal circuits 365 to the signal levels of the external circuits and the signal levels of the external circuits to the signal levels of the internal circuit 365. The input/output buffer is connected to the input/output pad 395 and to the ESD protection circuit 387. The ESD protection circuit 387 clamps excess ESD voltages to prevent damage to the input/output buffer 389 and the internal circuits 365 from ESD voltages brought in contact with the input/output pad 395 from the external environment.

Figure 4A:
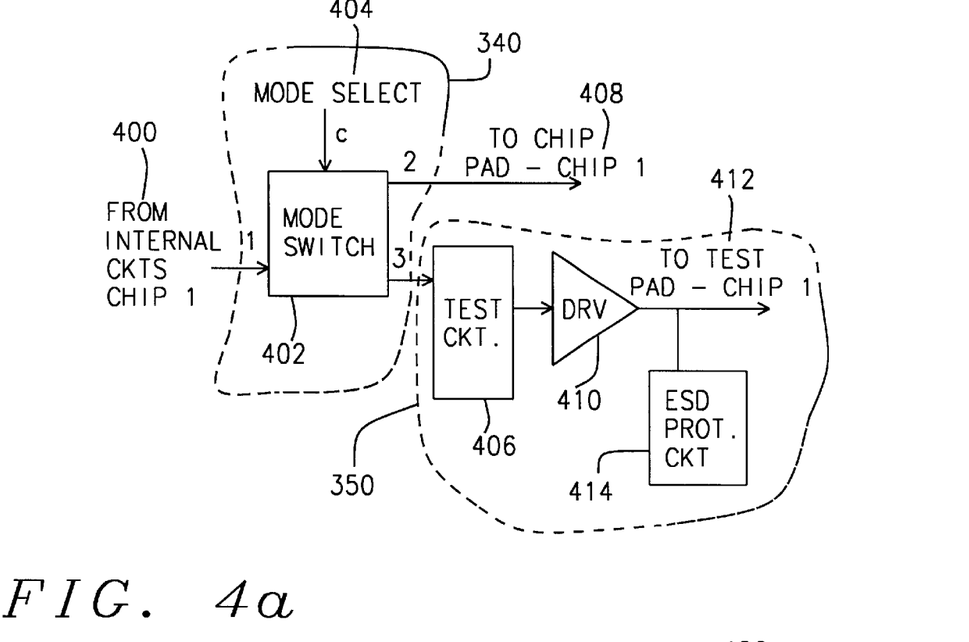
Figure 4B:
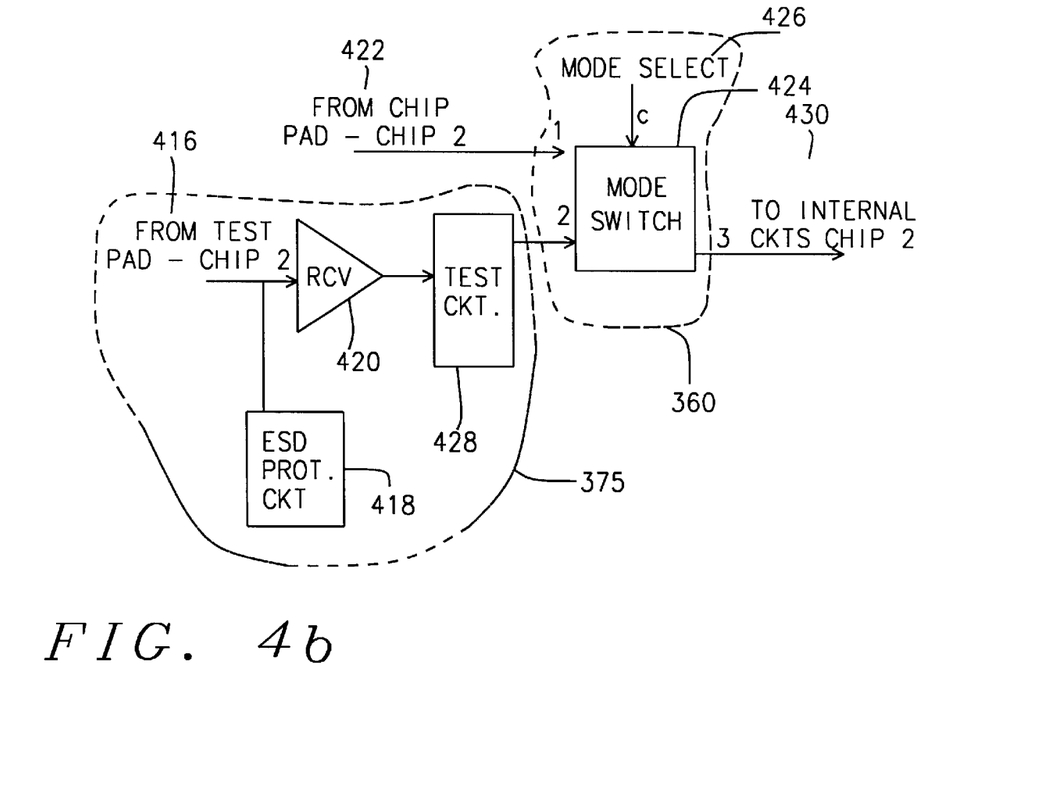
Figure 4C:
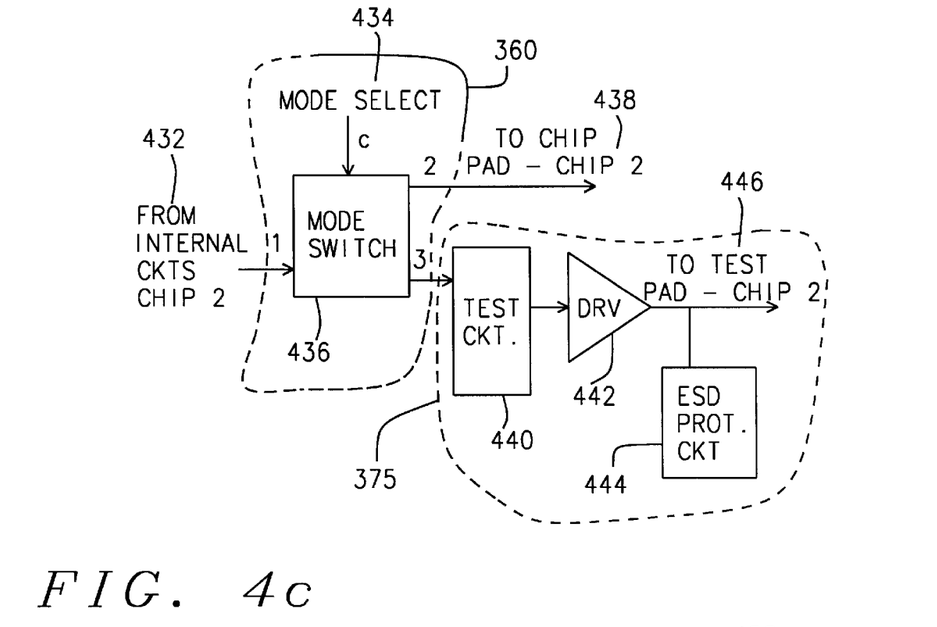
Figure 4D:
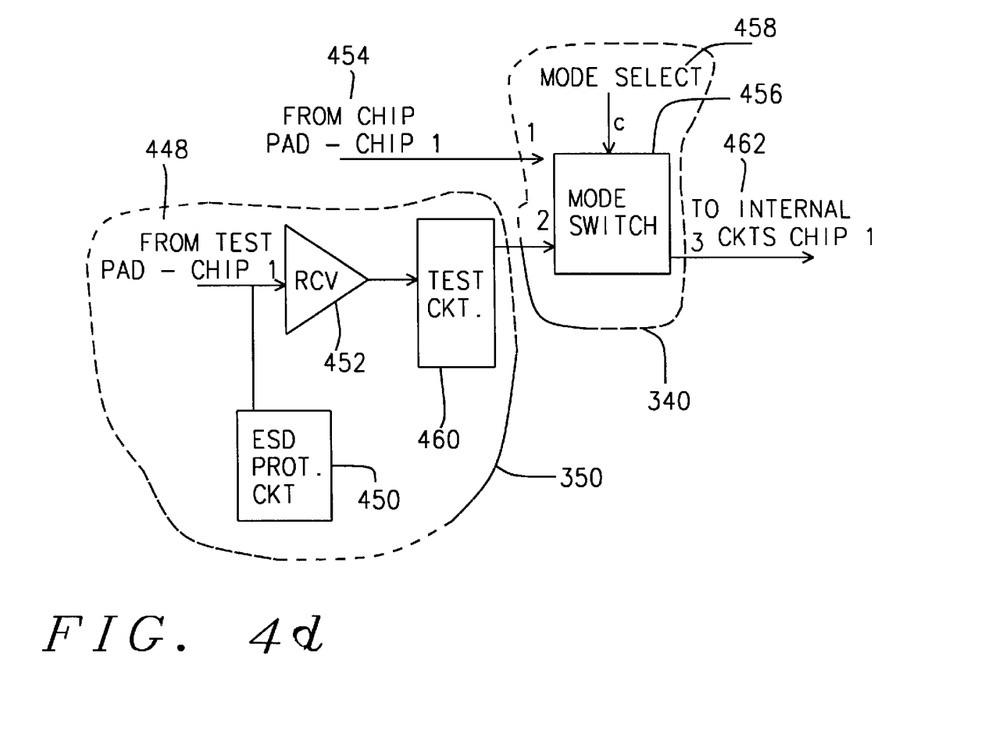

FIGS. 4a and 4d show schematically the connections of the interchip interface 340 and the test interface 350 of the first integrated circuit chip 305 of FIG. 3. FIG. 4a illustrates a path of a signal originated within the internal circuits 400 of the first integrated circuit chip and FIG. 4d illustrates a path of a signal originated externally and received by the internal circuits 462 of the first integrated circuit chip.

Referring now to FIG. 4a, the interchip interface 340 is comprised of a mode switch 402 and a mode selector 404. The signal 400 originating from the internal circuit of the first integrated circuit chip is connected to a first terminal of the mode switch 402. The second terminal of the mode switch 402 is connected directly to an input/output pad of the first integrated circuit chip and thus to the internal circuits of the second integrated circuit chip, as described above. The third terminal of the mode switch 402 is connected to the test interface 350. The test interface circuit 350 is composed of the test circuit 406 connected to an input of a driver circuit 410.

The output of the driver circuit is connected to a test input/output pad 412 and to the ESD protection circuit 414. The ESD protection circuit 414 operates as the ESD protection circuit 387 of FIG. 3 and clamps excessive ESD voltage to protect the test interface circuit 350 from damage during handling of the wafer containing the first integrated circuit chip for manufacturing, assembly, and testing.

The control terminal of the mode switch 402 is connected to a mode selector 404 to control the function of the interchip interface 340. When the mode selector 404 is at a first logic state, the internal circuits 400 of the first integrated circuit chip are connected to the input/output 408 and thus to the internal circuits of the second integrated circuit chip. When the mode selector 404 is at a second logic state, the internal circuits 400 of the first integrated circuit chip are connected to the test interface circuit 350. The mode selector 404 is set to the second state during the testing procedures of the wafer containing the first integrated circuit chip. Conversely, when the mode selector 404 is set to the first logic state during the normal operation of the "chip-on-chip" structure.

Referring to FIG. 4d, the signals originating in the internal circuits of the second integrated circuit chip are transferred to the chip pad 454 of the first integrated circuit. The chip pad 454 is connected to the first terminal of the mode switch 456. The test interface circuit 350 is connected to the second terminal of the mode switch 456. The third terminal of the mode switch 456 is connected to the internal circuits 462 of the first integrated circuit chip. The control terminal of the mode switch 456 is connected to the mode selector 458 to control the function of the interchip interface 340. If the control terminal of the mode switch 458 is at the first logic state, the chip pad 454 of the first integrated circuit chip and thus internal circuits of the second integrated circuit chip are connected to the internal circuits of the first integrated circuit chip. Conversely, if the control terminal of the mode switch 458 is at the second logic state, the test interface circuit 350 is connected to the internal circuit of the first integrated circuit chip.

As described above, the mode selector 458 is set to the second logic state during the testing procedures of the wafer containing the first integrated circuit chip and the mode selector 458 is set to the first logic state during the normal operation of the "chip-on-chip" structure.

FIGS. 4b and 4c show schematically the connections of the interchip interface 360 and the test interface 375 of the second integrated circuit chip 310 of FIG. 3. FIG. 4b illustrates a path of a signal originated within the internal circuits 430 of the second integrated circuit chip and FIG. 4c illustrates a path of a signal originated externally and received by the internal circuits 432 of the second integrated circuit chip.

FIG. 4b shows the instance where the signals originate on the first integrated circuit chip and are transferred through to the input/output pad 422 of the second integrated circuit chip. The input/output pad 422 is connected to the first terminal of the mode switch 424. The test interface circuit 375 is connected to the second terminal of the mode switch 424. The third terminal of the mode switch 424 is connected to the internal circuits 430 of the second integrated circuit chip. The control terminal of the mode switch 424 is connected to the mode selector 426, which operates as described above. If the mode selector 426 is at the first logic state, the signals from the internal circuit of the first integrated circuit chip are connected through the input/output pad 422 to the internal circuits 430 of the second integrated circuit chip. Alternately, if the mode selector is at the second logic state, the test signals from an external test system are transferred through the test interface 350 to the internal circuits 430 of the second integrated circuit chip. Again, as described above, the mode selector 426 is set to the first logic state during normal operation and is set to the second logic state during testing procedures.

The test interface is similar to that described in FIG. 4d. The test signals originating in an external test system are applied to a test input/output pad 416. The test input/output pad 416 is connected to a receiver 420 an ESD protection circuit 418. The receiver 420 translates the test signals to signal levels acceptable by the test circuit 428 and the internal circuits 430 of the second integrated circuit chip.

The ESD protection circuit 418 clamps ESD voltages applied to the test pad 416 to prevent damage to the second integrated circuit chip. The test circuits 428 format the test signals for application to the internal circuits 436 of the second integrated circuit chip.

FIG. 4c shows the instance where the signals originate in the internal circuits 432 of the second integrated circuit chip and are transferred through chip pad 438 to the first integrated circuit chip. The first terminal of the mode switch 436 receives the signals from the internal circuits 432 of the second integrated circuit chip. The second terminal of the mode switch 436 is connected to the chip pad 438. The third terminal is connected to the test interface 375. The control terminal is connected to the mode selector 434.

As described above, the mode selector 434 determines the connection of the internal circuits 432 to either the chip pad 438 or the test interface circuit 375. If the mode selector 434 is at the first logic state, the internal circuits 432 are connected through the chip pad 438 to the internal circuits of the first integrated circuit chip. Alternately, if the mode selector 434 is set to the second logic state, the internal circuits 432 are connected to the test interface circuit 375.

The mode selector 434 is set to the first logic state during normal system operation and to the second logic state during testing procedures.

Figure 5A:
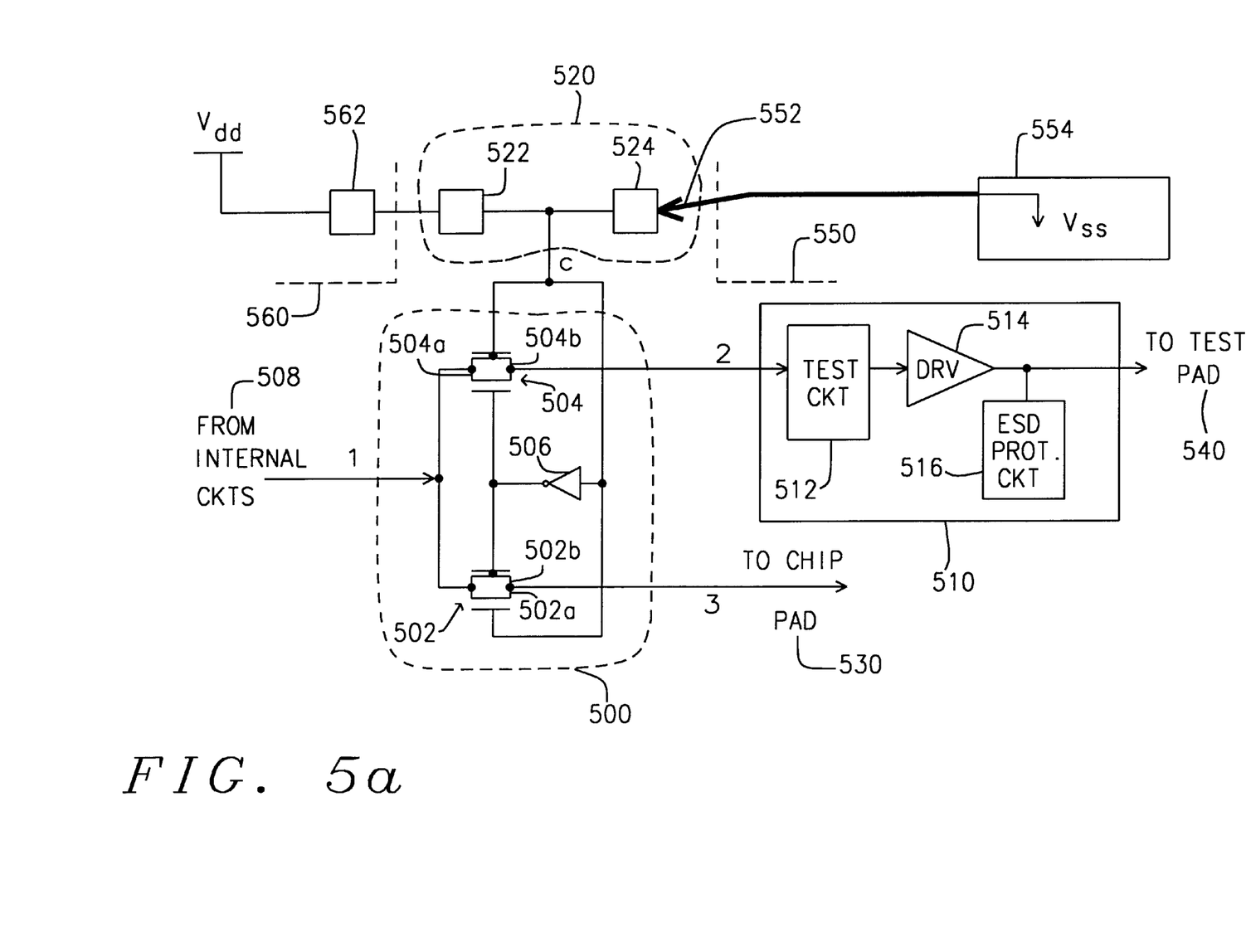
FIGS. 5a and 5b are schematic drawings of an embodiment of the interchip interface of this invention.
Figure 5B:
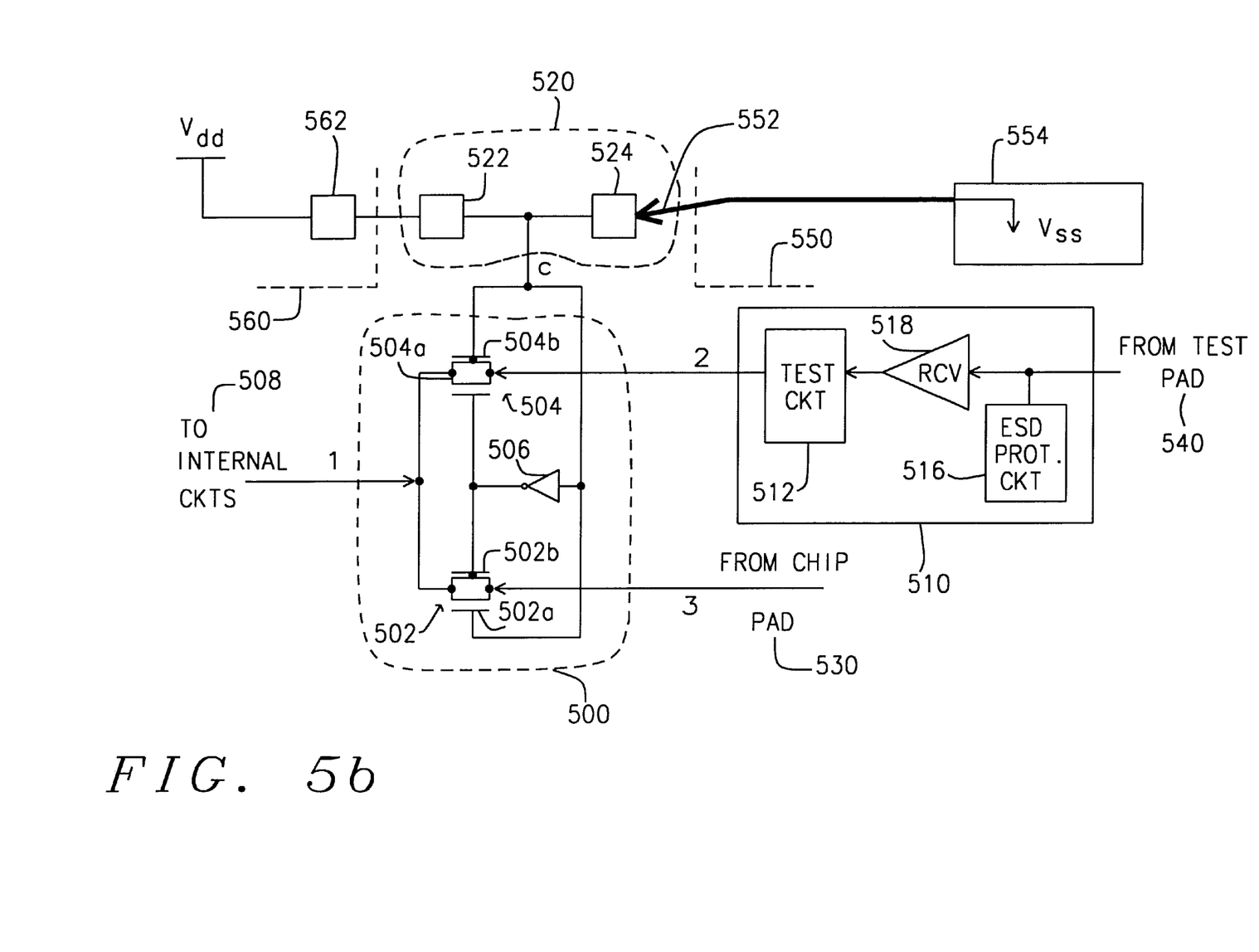

FIGS. 5a and 5b illustrate the structure of an embodiment of the mode switch and the mode selector shown in FIGS. 3 and 4 a–d. FIG. 5a shows the mode switch 500 and mode selector 520 for signals originated from the internal circuits 508 from the first or second integrated circuit chips. Alternately, FIG. 5b shows the mode switch 500 and mode selector 520 for signals originated externally and transferred to the internal circuits 508 of the first or second integrated circuit chips.

Referring now to FIG. 5a, the first terminal of the mode switch 500 is connected to the internal circuits 508, the second terminal of the mode switch 500 is connected to the test interface circuit 510 and the third terminal of the mode switch 500 is connected to the interchip input/output pad 530.

The mode switch is comprised of the pass switches 502 and 504 and inverter 506. The pass switch 502 is the parallel combination of the n-channel metal oxide semiconductor (NMOS) transistor 502a and p-channel metal oxide semiconductor (PMOS) transistor 502b. Likewise, the pass switch 504 is the parallel combination of the NMOS transistor 504a and the PMOS transistor 504b. The first terminal of the mode switch 500 and thus the internal circuits 508 are connected to the drains of the pass switches 502 and 504. The sources of the pass switch 502 are connected to the third terminal of the mode switch 500 and thus to the interchip input/output pad 530. The sources of the pass switch 504 are connected to the second terminal of the mode switch 500 and thus to the test interface circuit 510. The gates of the NMOS transistor 504a and the PMOS transistor 502b are connected to the output of the inverter 506. The gates of the NMOS transistor 502a, PMOS transistor 504b, and the input of the inverter 506 are connected to the control terminal of the mode switch 500 and thus to the mode selector 520.

When the control terminal of the mode switch 500 is at the first logic state, in this case a voltage level approaching that of the power supply voltage source $V_{DD}$, the pass switch 502 is turned on and the pass switch 504 is turned off. This effectively connects the internal circuits 508 to the interchip input/output pad 530. In this logic state, the extra electrical load is from the drain of the pass switch 502 and the pass switch 504. This electrical load is very small and thus highly improved performance can be expected over the prior art. Conversely, when the control terminal of the mode switch 500 is at the second logic state, in this case a voltage level approaching that of the substrate biasing voltage source $V_{SS}$, the pass switch 504 is turned on and the pass switch 502 is turned off. The internal circuits are now effectively connected to the test interface circuit 510.

The test interface circuit 510 is comprised of the test circuit 512, the driver circuit 514, and the ESD protection circuit 516. The test interface circuit functions as described in FIGS. 4a and 4c.

The mode select circuit is the interchip input/output pad 522 and the test input/output pad 524 connected together and to the control terminal of the mode switch 500. The interchip input/output pad 522 is connected as described in FIG. 3 to a mating interchip input/output pad 562 that are joined by a solder bump or ball. The mating interchip input/output pad 562 is on the mating chip 560 and is connected to the power supply voltage source $V_{DD}$ to provide the first logic state to the control terminal of the mode switch 500 during normal operation. The test input/output pad is connected to the test system 550 during the testing procedures. During the test procedures, a test probe or needle 552 is brought in contact with the test input/output pad. The test probe or needle 552 is connected on a probe card 554 within the test system 550 to the substrate biasing voltage source $V_{SS}$ to provide the second logic state to the control terminal of the mode switch 500.

The fundamental connections shown in FIG. 5b are as described in FIG. 5a except the test signal originates from the test system attached to the input/output pad 540. The test interface circuit 510 in this case is comprised of the test circuits 512, the receiver 518, and the ESD protection circuit and functions as described in FIGS. 4b and 4d.

Signals originating from the external circuits are applied to the interchip input/output pad 530 and transferred through the pass switch 502 to the internal circuits 508 during normal operation. Likewise, the test signals are transferred from the test interface 510 through the pass switch 504 to the internal circuits 508 during the test procedures.

Figure 6A:
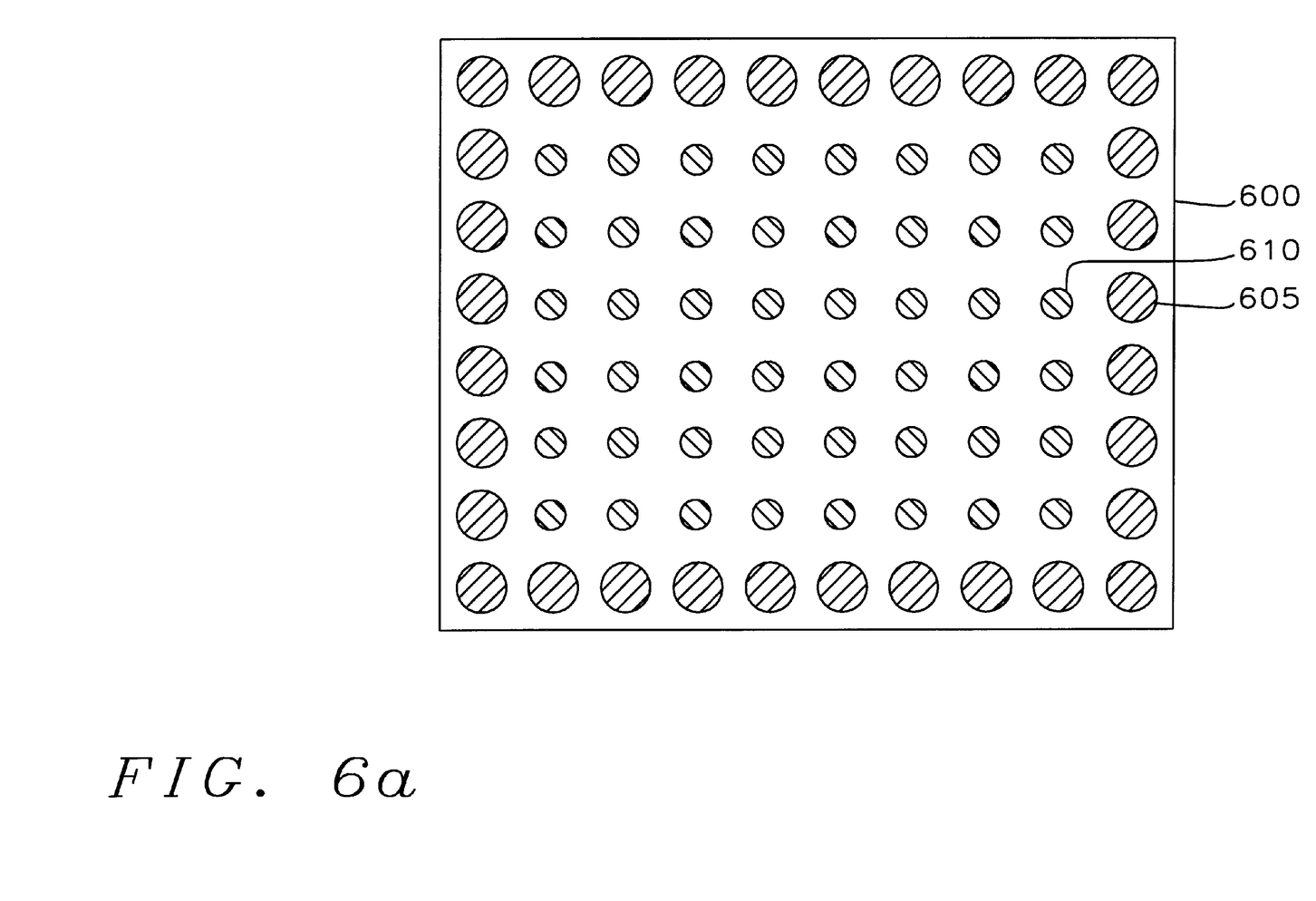
FIGS. 6a and 6b are top surface views of the first and second integrated circuit chips of FIG. 3 showing test pads and interchip input/output pads of this invention.

FIG. 6a shows a top surface view of the first integrated circuit chip 600 illustrating the placement of the test input/output pads 605 and the interchip input/output pads 610. The interchip input/output pads 610 form an area array of solder balls or bumps 315 of FIG. 3. The test input/output pads 605 are peripherally arranged so that the test probes or needles of the test system can conveniently make contact with the test input/output pads 605.

Figure 6B:
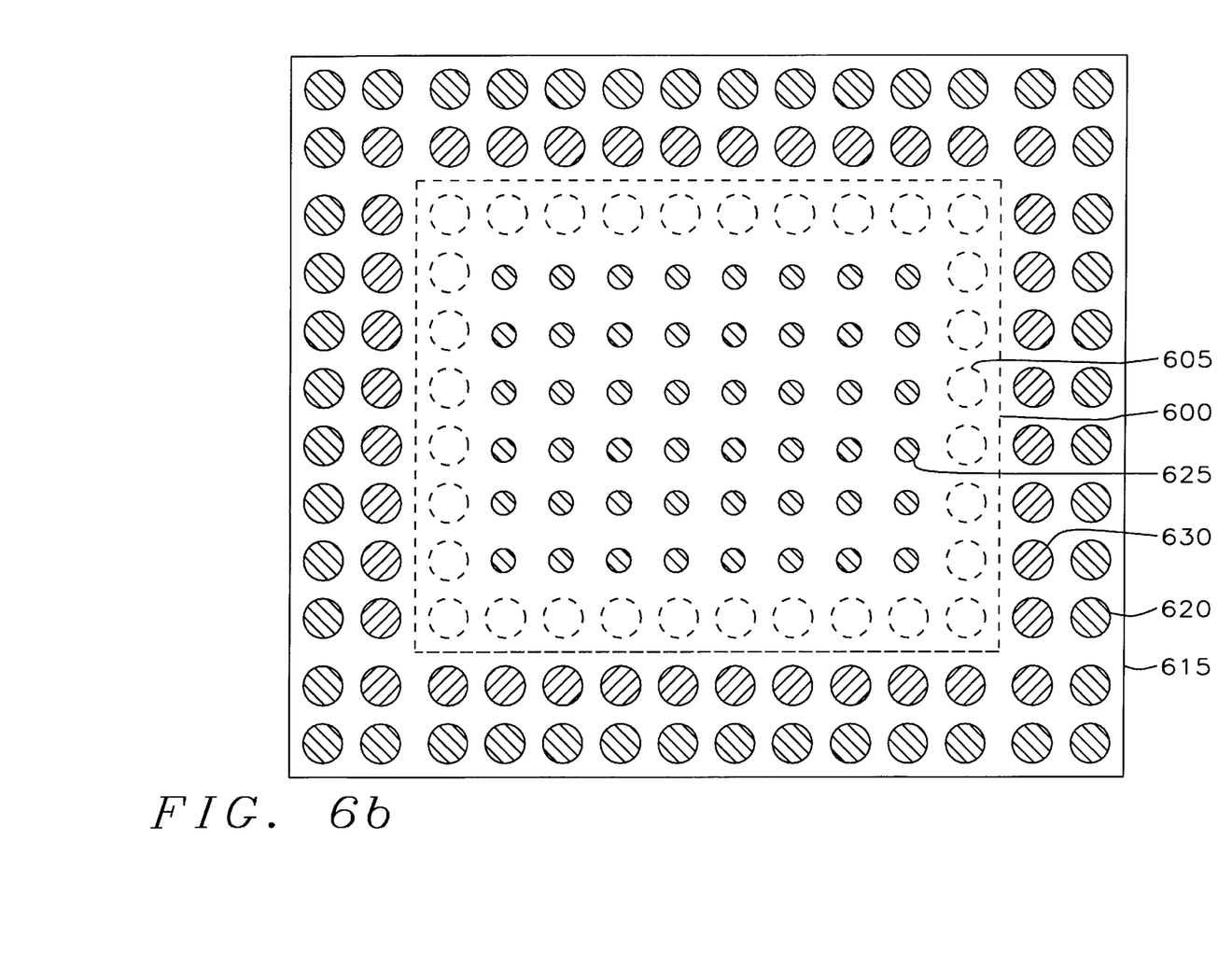

FIG. 6b shows the top surface view of the second integrated circuit chip 615 illustrating the placement of the interchip input/output pads 625 and the external input/output pads 620. The interchip input/output pads 625 form the area array to mate with the interchip input/output pads 610 of FIG. 5a. The first integrated circuit chip 600 is mounted "face-to face" to the second integrated circuit chip 615. The test input/output pads 605 must have nothing on the surface of the second integrated circuit chip 625 in their "shadow."

The test input/output pads 630 and the external input/output pads 620 are formed in the periphery of the second integrated circuit chip 615. The external input/output pads 620 must be placed outside the shadow of the first integrated circuit chip 600. The test input/output pads 630 are placed conveniently so that test probes or needles of a test system can contact the test input/output pads 630. The test input/output pads 605 and 630 are connected as shown in FIGS. 5a and 5b to the test interface 510. The test input/output pads 605 and 630 transfer stimulus and response signals between the test system 550 and either the first integrated circuit chip 600 or second integrated circuit chip 615.

While this invention has been particularly shown and described with reference to the preferred embodiments thereof, it will be understood by those skilled in the art that various changes in form and details may be made without departing from the spirit and scope of the invention.

The invention claimed is:

1. A multiple interconnected integrated circuit chip structure comprising a first integrated circuit chip and a second integrated circuit chip comprising:

whereby the first integrated circuit chip is mounted to the second chip to physically and electrically connect the first integrated circuit chip to the second integrated circuit chip;

whereby the first integrated circuit chip has interchip interface circuits connected to the second integrated circuit chip to selectively communicate between internal circuits of the first and second integrated circuit chips and test circuits connected to internal circuits of the first integrated circuit chip to provide stimulus and response to said internal circuits;

whereby the second integrated circuit chip has input/output interface circuitry to communicate with external circuitry connected to said second integrated circuit chip and to protect said second integrated circuit chip from electrostatic discharge voltages;

whereby the interchip interface circuitry comprises:
an internal interface circuit for transferring electrical signals between the second integrated circuit chip and the first integrated circuit chip;
a mode select switch having a first terminal connected to an input/output pad, a second terminal connected to the internal circuitry of the integrated circuit chip, a third terminal connected to test circuits, and
a mode selector to selectively connect the output of the internal interface circuit to the internal circuitry of the first integrated circuit chip during normal operation and the output of the internal interface circuit to the test circuitry during test and burn-in.

2. The chip structure of claim 1 wherein the second integrated circuit chip further has interchip interface circuits connected to the first integrated circuit chip to selectively communicate between internal circuits of the first and second integrated circuit chips and test circuits connected to internal circuits of the second integrated circuit chip to provide stimulus and response to said internal circuits.

3. The chip structure of claim 1 wherein the first chip is mounted to the second chip by means of an area array of solder bumps.

4. The chip structure of claim 1 wherein the test circuits comprise:
test interface circuits connected to external test circuitry to communicate with said external test circuitry and
ESD protection circuits to protect said first and second integrated circuit chips from electrostatic discharge voltages.

5. The chip structure of claim 4 wherein the test interface circuit is connected to the external test circuitry through an input/output pad temporarily connected to said external test circuitry during test and burn-in.

6. The chip structure of claim 1 wherein the first integrated circuit chip is an array of memory cells and the second integrated circuit chip contains electronic circuitry formed with a process not compatible with a process of the array of memory cells.

7. The chip structure of claim 1 wherein the second integrated circuit chip is an array of memory cells and the first integrated circuit chip contains electronic circuitry formed with a process not compatible with a process of the array of memory cells.

8. The chip structure of claim 1 wherein the first integrated circuit chip is fabricated using a first type of semiconductor process and the second integrated circuit chip is fabricated with a second type of semiconductor process that is not compatible with the first type of semiconductor process.

9. The chip structure of claim 1 wherein the interchip interface circuit has no electrostatic discharge protection circuit.

10. The chip structure of claim 1 wherein the internal interface circuit is not capable of communication with the external circuitry.

11. The chip structure of claim 10 wherein the first and second pass switches are comprised of an NMOS transistor and PMOS transistor connected in parallel with a gate of the NMOS transistor being the first gate terminal of the first and second pass switches and a gate of the PMOS transistor being the second gate terminal of the first and second pass switches.

12. The chip structure of claim 1 wherein the mode switch comprises:

a first pass switch having a drain terminal connected to the internal circuits, a source terminal connected to an input/output pad connected to an attached integrated circuit chip, a first gate terminal connected to the mode selector, and a second gate terminal;

a second pass switch having a drain terminal connected to the internal circuits, a source terminal connected to the input/output pad connected to the attached integrated circuit chip, a first gate terminal, and a second gate terminal connected to the mode selector;

an inverter circuit having an input terminal connected to the mode selector and an output terminal connected to the second gate terminal of the first pass switch and the first gate of the second pass switch.

13. The chip structure of claim 1 wherein in the mode switch comprises:

an interchip input/output pad connected to a first logic state generator during normal operation;

a test input/output pad connected to a second logic state generator during testing procedures.

14. An interchip interface circuit formed in multiples upon a first and second integrated circuit chip for communication between internal circuits of the first and second integrated circuit chip;

whereby said first integrated circuit chip is attached physically and electrically to said second integrated circuit chip; and whereby said interchip interface circuit comprises:

an internal interface circuit for transferring electrical signals between the second integrated circuit chip to the first integrated circuit chip;

a mode select switch having a first terminal connected to an output of the internal interface circuit, a second terminal connected to the internal circuitry of one of the integrated circuit chip, a third terminal connected to test circuits, and a control terminal; and a mode selector connected to the control terminal to selectively connect the output of the internal interface circuit to the internal circuitry of the integrated circuit chips during normal operation and the output of the internal interface circuit to the test circuitry during testing procedures.

15. The interface circuit of claim 14 wherein the first chip is attached to the second chip by means of an area array of solder bumps.

16. The interface circuit of claim 14 wherein the test circuits comprise:

test interface circuits connected to external test circuitry to communicate with said external test circuitry; and an ESD protection circuit to protect said first and second integrated circuit chips from electrostatic discharge voltages.

17. The interface circuit of claim 16 wherein the test interface circuit is connected to the external test circuitry through an input/output pad temporarily connected to said external test circuitry during test and burn-in.

18. The interface circuit of claim 14 wherein the first integrated circuit chip is an array of memory cells and the second integrated circuit chip contains electronic circuitry formed with a process not compatible with a process of the array of memory cells.

19. The interface circuit of claim 14 wherein the second integrated circuit chip is an array of memory cells and the first integrated circuit chip contains electronic circuitry formed with a process not compatible with a process of the array of memory cells.

20. The interface circuit of claim 14 wherein the first integrated circuit chip is fabricated using a first type of semiconductor process and the second integrated circuit chip is fabricated with a second type of semiconductor process that is not compatible with the first type of semiconductor process.

21. The interface circuit of claim 14 wherein the interchip interface circuit has no electrostatic discharge protection circuit.

22. The interface circuit of claim 14 wherein the internal interface circuit is not capable of communication with the external circuitry.

23. The interface circuit of claim 14 wherein the mode switch comprises:

a first pass switch having a drain terminal connected to the internal circuits, a source terminal connected to an input/output pad connected to an attached integrated circuit chip, a first gate terminal connected to the mode selector, and a second gate terminal;

a second pass switch having a drain terminal connected to the internal circuits, a source terminal connected to the input/output pad connected to the attached integrated circuit chip, a first gate terminal, and a second gate terminal connected to the mode selector;

an inverter circuit having an input terminal connected to the mode selector and an output terminal connected to the second gate terminal of the first pass switch and the first gate of the second pass switch.

24. The interface circuit of claim 23 wherein the first and second pass switches are comprised of an NMOS transistor and PMOS transistor connected in parallel with a gate of the NMOS transistor being the first gate terminal of the first and second pass switches and a gate of the PMOS transistor being the second gate terminal of the first and second pass switches.

25. The interface circuit of claim 23 wherein in the mode switch comprises:

an interchip input/output pad connected to a first logic state generator during normal operation;

a test input/output pad connected to a second logic state generator during testing procedures.

* * * * *